United States Patent
Chen et al.

(10) Patent No.: US 6,306,723 B1
(45) Date of Patent: Oct. 23, 2001

(54) METHOD TO FORM SHALLOW TRENCH ISOLATIONS WITHOUT A CHEMICAL MECHANICAL POLISH

(75) Inventors: Feng Chen; Kok Hin Teo, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/524,528

(22) Filed: Mar. 13, 2000

(51) Int. Cl.[7] .................................................. H01L 21/76
(52) U.S. Cl. ............................................................ 438/429
(58) Field of Search ................................ 73/754; 438/424, 438/429, 305, 296, 221, 437, 655, 427

(56) References Cited

U.S. PATENT DOCUMENTS

| | | | |
|---|---|---|---|
| 5,087,586 | 2/1992 | Chan et al. | 437/74 |
| 5,212,110 | 5/1993 | Pfiester et al. | 437/67 |
| 5,236,863 | 8/1993 | Iranmanesh | 437/90 |
| 5,387,538 | 2/1995 | Moslehi | 437/67 |
| 5,416,041 | 5/1995 | Schwalke | 437/62 |
| 5,472,903 | 12/1995 | Lur et al. | 437/67 |
| 5,496,765 | 3/1996 | Schwalke | 437/67 |
| 5,536,675 | * 7/1996 | Bohr et al. | 438/427 |
| 5,668,043 | 9/1997 | Park | 437/61 |
| 5,731,241 | * 3/1998 | Jang et al. | 438/424 |
| 5,888,881 | 3/1999 | Jeng et al. | 438/425 |
| 6,204,137 | * 3/2001 | Teo et al. | 438/305 |

* cited by examiner

Primary Examiner—William Oen
(74) Attorney, Agent, or Firm—George O. Saile; Rosemary L. S. Pik

(57) ABSTRACT

A new method of fabricating shallow trench isolations has been achieved. No final polishing down process is needed. A silicon substrate is provided. A pad oxide layer is formed overlying the silicon substrate. A silicon nitride layer is deposited overlying the pad oxide layer. The silicon nitride layer, the pad oxide layer, and the silicon substrate are patterned to form trenches for planned shallow trench isolations. A liner oxide layer is grown overlying the semiconductor substrate is the trenches. A silicon dioxide spacer layer is deposited overlying the silicon nitride layer and the liner oxide layer to partially fill the trenches. The silicon dioxide spacer layer and the liner oxide layer are anisotropically etched to form sidewall spacers inside the trenches and to expose the bottom of said trenches. A silicon layer is selectively grown overlying the semiconductor substrate in the trenches. The silicon layer partially fills the trenches. A trench oxide layer is formed overlying the silicon layer. The silicon nitride layer is removed. The pad oxide layer is removed to complete the shallow trench isolation, and the integrated circuit device is completed.

20 Claims, 4 Drawing Sheets

METHOD TO FORM SHALLOW TRENCH ISOLATIONS WITHOUT A CHEMICAL MECHANICAL POLISH

BACKGROUND OF THE INVENTION (1) Field of the Invention

The invention relates to a method of fabricating silicon structures, and more particularly, to the formation of shallow trench isolations in the manufacture of integrated circuit devices.

(2) Description of the Prior Art

The use of shallow trench isolation (STI) for the formation of integrated circuit isolations has grown in the art due to the reduced surface area and improved topology of STI when compared to traditional local oxidation of silicon (LOCOS) schemes. One problem that is encountered in the use of STI is oxide dishing.

Referring to FIG. 1, a cross-section of a partially completed prior art integrated circuit is shown. A semiconductor substrate 10 is shown. A trench has been etched into the surface of the semiconductor substrate 10. An isolation oxide layer 14 fills the trenches. A chemical mechanical polish (CMP) was used to polish down the isolation oxide layer 14 to the top surface of the silicon substrate 10 to complete the shallow trench isolations. Following the polish, however, significant dishing 18 has occurred.

Oxide dishing occurs, in part, due to pad deformation in the chemical mechanical polish (CMP) process used to planarize the STI structures. Dishing is especially pronounced on large or wide STI structures because the isolation oxide over these trenches is typically thinner than the oxide deposited over narrow trenches due to topological effects. Narrower STI structures may demonstrate little or no dishing. This dishing 18 can cause increased current leakage and decreased gate oxide voltage breakdown. These problems at the active area interface reduce device yield.

Referring now to FIG. 2, a second prior art integrated circuit demonstrates a second potential problem. Again, a trench has been etched into the surface of a semiconductor substrate 20. An isolation oxide layer 24 is again deposited in the trench. In this case, no CMP process is used to remove the excess oxide. Therefore, the isolation oxide layer 24 is left protruding above the surface of the semiconductor substrate 20. This topology creates corners 28 on the STI. During the subsequent formation of sidewall spacers on the transistor gates, in the case of a MOS process, parasitic spacers will also form on these STI sidewalls 28. These parasitic spacers will reduce the device active area and can cause problems in forming drain or source contacts.

Several prior art approaches disclose methods to create isolation regions in the silicon substrate. U.S. Pat. No. 5,087,586 to Chan et al teaches a process to form shallow trench isolations. Temporary silicon nitride or combination silicon nitride and silicon dioxide sidewall spacers are formed on trench sidewalls. Silicon is epitaxially grown in the trenches. The sidewall spacers are then removed. A trench oxide fill layer is deposited to completely fill the trenches. Because the trench oxide fill layer is deposited by a conformal CVD process, a final polish down is required to planarize the area. U.S. Pat. No. 5,236,863 to Iranmanesh teaches a method to form shallow trench isolations. A three-layer stack of silicon dioxide, silicon nitride, and silicon dioxide is formed over the substrate. The top silicon dioxide layer is used as a required hard mask in the trench etch process. After trench etching and preparation, a thin oxide is optionally grown over the silicon trench fill layer. A thicker oxide layer is then deposited. A photoresist layer is deposited. A planarizing etch must be performed due to the conformal deposition process used to deposit the thicker oxide layer. This method forms an oxide layer between spacers. U.S. Pat. No. 5,472,903 to Lur et al discloses a process to form isolations. An oxide over nitride over oxide stack is formed over the substrate. Trenches are etched through the stack and into the substrate. Polysilicon columns are formed inside the trenches using temporary nitride columns in the process. The polysilicon columns are oxidized to form a silicon dioxide filler for the trenches. U.S. Pat. No. 5,387,538 to Moslehi teaches a method to form trench isolations. Trenches are etched into the substrate and then lined with oxide. The trench is lined with silicon nitride. A polysilicon or amorphous silicon layer is deposited over the nitride. Temporary sidewalls are then formed in the trenches. A silicon island is grown in the trenches over the polysilicon or amorphous silicon layer. The temporary spacers are then removed. The silicon island is then completely oxidized to form the trench filler. U.S. Pat. No. 5,496,765 to Schwalke and U.S. Pat. No. 5,416,041 to Schwalke disclose processes to form trench isolations in a silicon on insulator (SOI) process. U.S. Pat. No. 5,668,043 to Park discloses a method to form field oxide (FOX) regions using a transitional metal spacer to create peripheral trenches. U.S. Pat. No. 5,888,881 to Jeng et al teaches a process to form field oxide regions. A polysilicon or amorphous silicon layer is oxidized to form the filler for narrow trenches in this process. U.S. Pat. No. 5,212,110 to Pfiester et al discloses a trench isolation method using a silicon germanium layer.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolations in which no polishing step is needed.

Another further object of the present invention is eliminate the polishing step by selectively growing and then oxidizing a silicon layer in the shallow trenches.

In accordance with the objects of this invention, a new method of fabricating shallow trench isolations has been achieved. A silicon substrate is provided. A pad oxide layer is formed overlying the silicon substrate. A silicon nitride layer is deposited overlying the pad oxide layer. The silicon nitride layer, the pad oxide layer, and the silicon substrate are patterned to form trenches for planned shallow trench isolations. A liner oxide layer is grown overlying the semiconductor substrate in the trenches. A silicon dioxide spacer layer is deposited overlying the silicon nitride layer and the liner oxide layer to partially fill the trenches. The silicon dioxide spacer layer and the liner oxide layer are anisotropically etched to form sidewall spacers inside the trenches and to expose the bottom of said trenches. A silicon layer is selectively grown overlying the semiconductor substrate in the trenches. The silicon layer partially fills the trenches. A trench oxide layer is formed overlying the silicon layer. The silicon nitride layer is removed. The pad oxide layer is removed to complete the shallow trench isolation, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
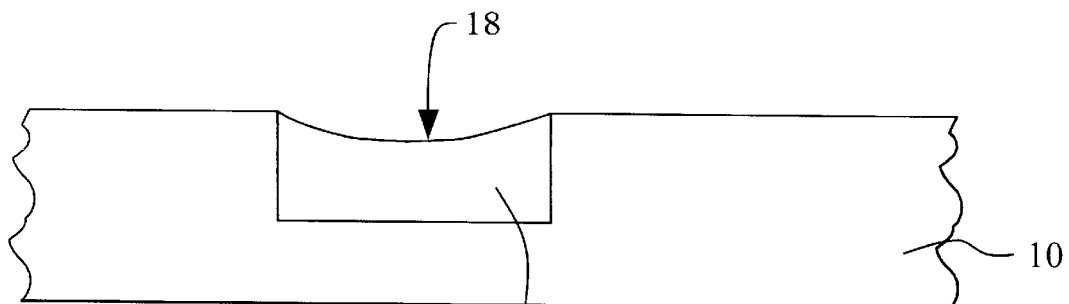
FIGS. 1 and 2 schematically illustrate in cross-section partially completed prior art integrated circuit devices.
Figure 2:
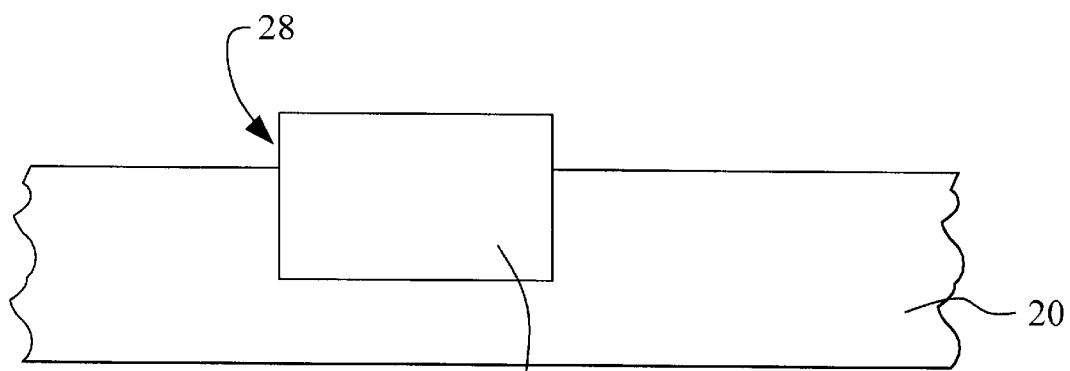
Figure 3:
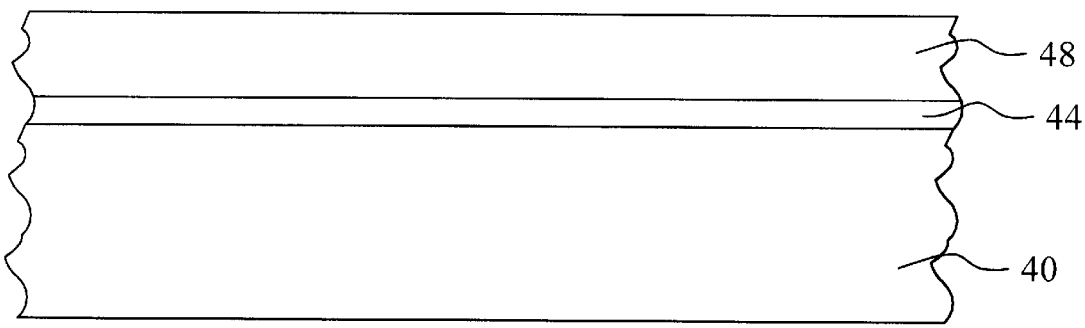
FIGS. 3 through 11 schematically illustrate in cross-sectional representation a preferred embodiment of the present invention.

Referring now more particularly to FIG. 3, there is illustrated a cross section of a partially completed integrated circuit device of the preferred embodiment. The semiconductor substrate 40 is preferably composed of monocrystalline silicon. A pad oxide layer 44 is grown overlying the semiconductor substrate 40. The pad layer 44 is comprised of silicon dioxide grown by exposing the semiconductor substrate 40 to an oxidizing atmosphere in a thermal chamber. The purpose of the pad oxide layer 44 is to reduce stress in the semiconductor substrate 40 and to promote adhesion of the subsequently deposited silicon nitride layer. The pad oxide layer 44 is preferably grown to a thickness of between about 50 Angstroms and 200 Angstroms.

A silicon nitride layer 48 is deposited overlying the pad oxide layer 44. The silicon nitride layer 48 is preferably deposited using a low-pressure chemical vapor deposition (LPCVD) process. The silicon nitride layer 48 serves as an etching stop during the subsequent formation of sidewall spacers. In the preferred embodiment, the silicon nitride layer 48 is deposited to a thickness of between about 800 Angstroms and 2,000 Angstroms.

Figure 4:
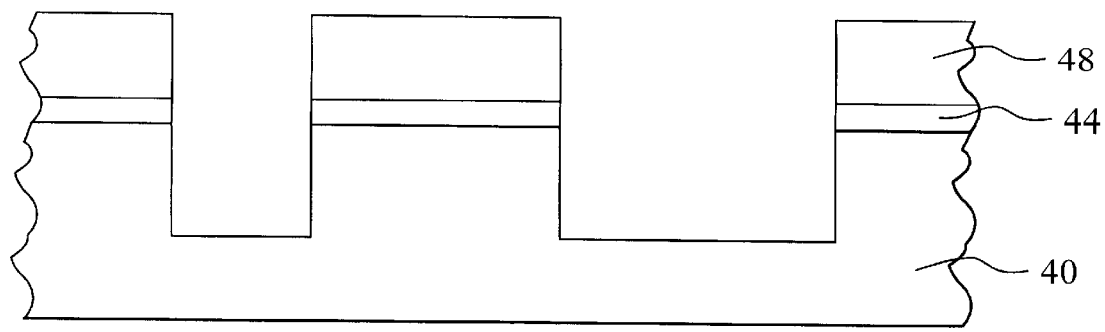

Referring now to FIG. 4, the silicon nitride layer 48, the pad oxide layer 44, and the semiconductor substrate 40 are patterned to form trenches for planned shallow trench isolations. The etching step is done using a conventional reactive ion etch (RIE).

Figure 5:
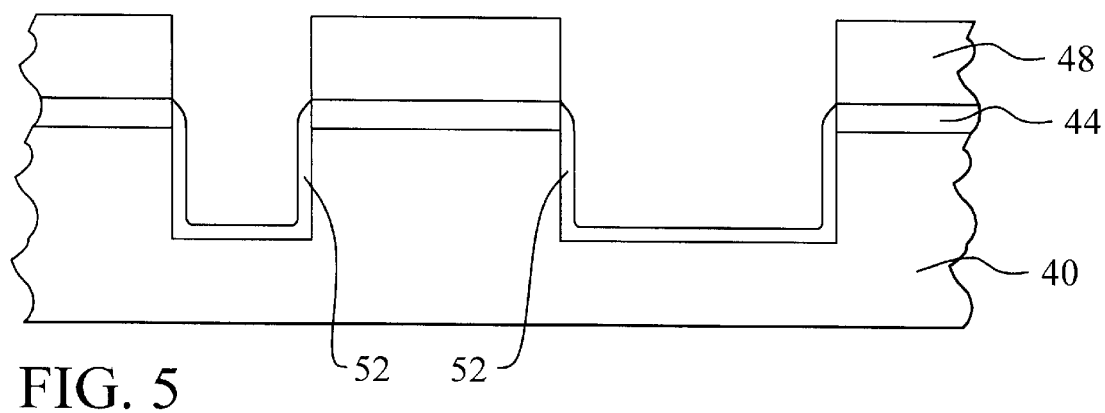

Referring now to FIG. 5, a liner oxide layer 52 is grown overlying the semiconductor substrate 40 in the trenches. The liner oxide layer 52 improves the performance of the completed STI by reducing surface stress in the trench that was induced by the etching process. The liner oxide layer 52 is preferably grown by a thermal oxidation process to a thickness of between about 50 Angstroms and 400 Angstroms.

Figure 6:
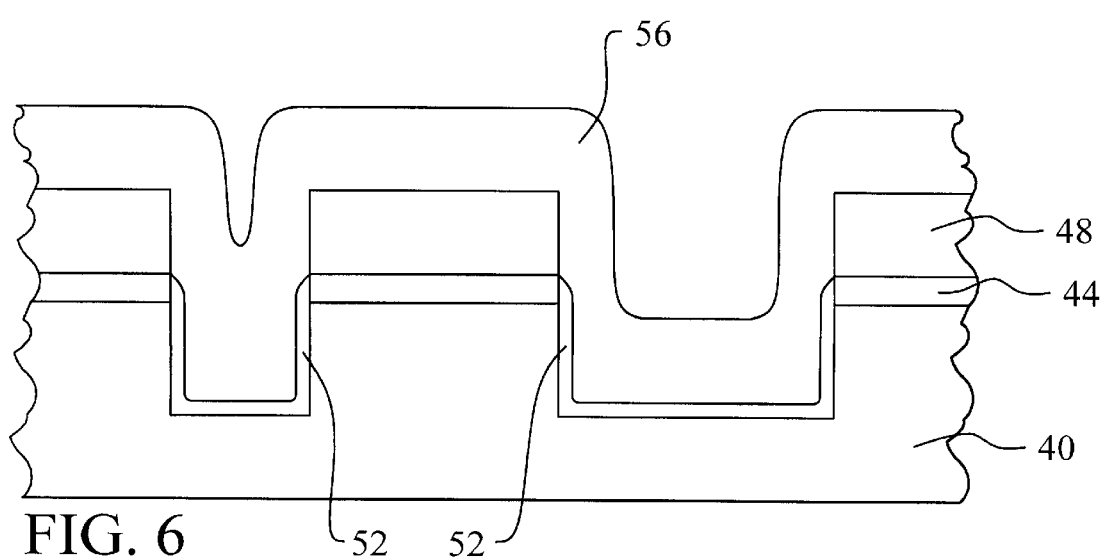

Referring now to FIG. 6, an important aspect of the present invention is illustrated. A silicon dioxide spacer layer 56 is deposited overlying the silicon nitride layer 48 and the liner oxide layer 52 to partially fill the trenches. The silicon dioxide spacer layer 56 is preferably deposited by low-pressure chemical vapor deposition (LPCVD). The silicon dioxide spacer layer 56 is deposited to a thickness of between about 800 Angstroms and 3,000 Angstroms.

Figure 7:
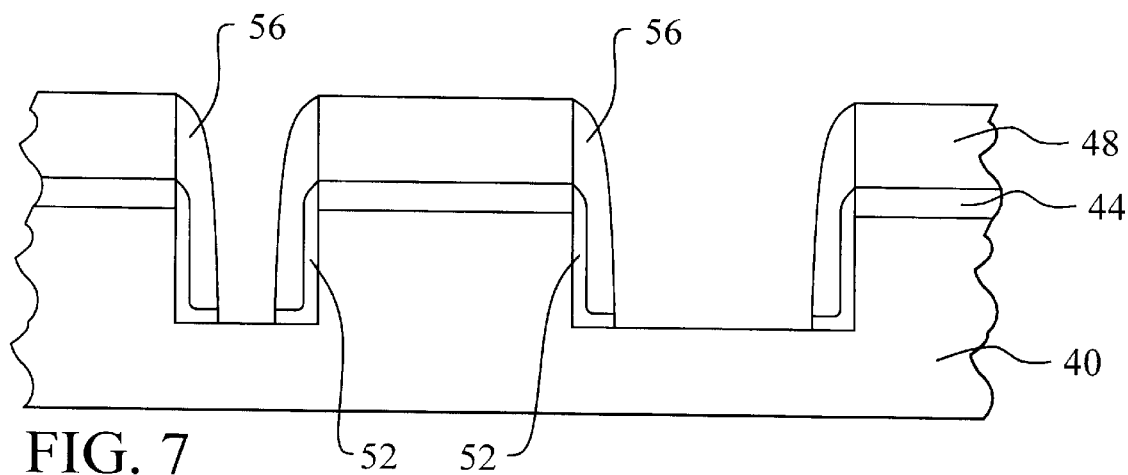

Referring now to FIG. 7, another important part of the present invention is described. The silicon dioxide spacer layer 56 and the liner oxide layer 52 are anisotropically etched to form sidewall spacers inside the trenches. The silicon dioxide spacer layer 56 is removed from the lateral surfaces and the liner oxide layer 52 is etched through causing the formation of the sidewall spacers. The etching process comprises a plasma etching process, such as those well known in the art, that removes silicon dioxide while stopping at the silicon nitride layer 48.

The sidewall spacers 56 are important for two reasons. First, the sidewall spacers 56 insure that a good dielectric isolation is formed along the edges of the shallow trench isolations. Next, and particular to the present invention, the sidewall spacers 56 define areas in trenches where silicon will not be grown in the subsequent processing step. Without the sidewall spacers 56, the silicon plugs would be formed too close to the edges of the trenches to allow for an effective isolation dielectric. Finally, the sidewall spacers 56 are self-aligned to the edges of the trenches and, therefore, no masking operation is required to form them.

Figure 8:
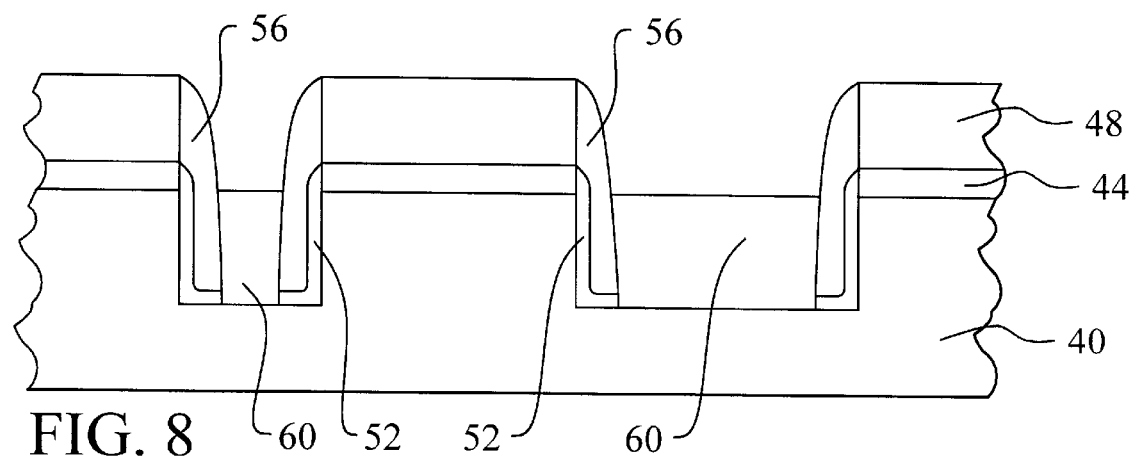

Referring now to FIG. 8, another important aspect of the present invention is described. A silicon layer 60 is grown overlying the semiconductor substrate 40. This step of growing silicon 60 is selective to grow only where the semiconductor substrate 40 is exposed in the trenches. Therefore, no silicon layer 60 is grown overlying the silicon nitride layer 48. In addition, the step of growing the silicon layer is stopped before the silicon layer 36 exceeds the top surface of the trench. The silicon layer 60 is grown using a selective epitaxial growth (SEG) process in an epitaxial reactor. The process occurs at a temperature of between about 500 degrees C. and 1,200 degrees C. and a pressure of between about 20 Torr and 100 Torr. The SEG process uses a silicon source chemistry comprising: $SiCl_4$, $H_2$, $SiH_4$, $SiH_2Cl_2$, and HCl.

The SEG process will only grow the silicon layer 60 on the exposed silicon substrate 40. Therefore, the silicon nitride layer 48 and the sidewall spacers 56 confine the silicon layer 60 so formed to the trenches. In addition, the SEG process is stopped before the silicon layer 60 grows above the top surface of the trenches. This will allow a subsequently formed oxide layer to completely cover the silicon plugs 60 and yet not require a polishing down operation for completing the STI.

Figure 9:
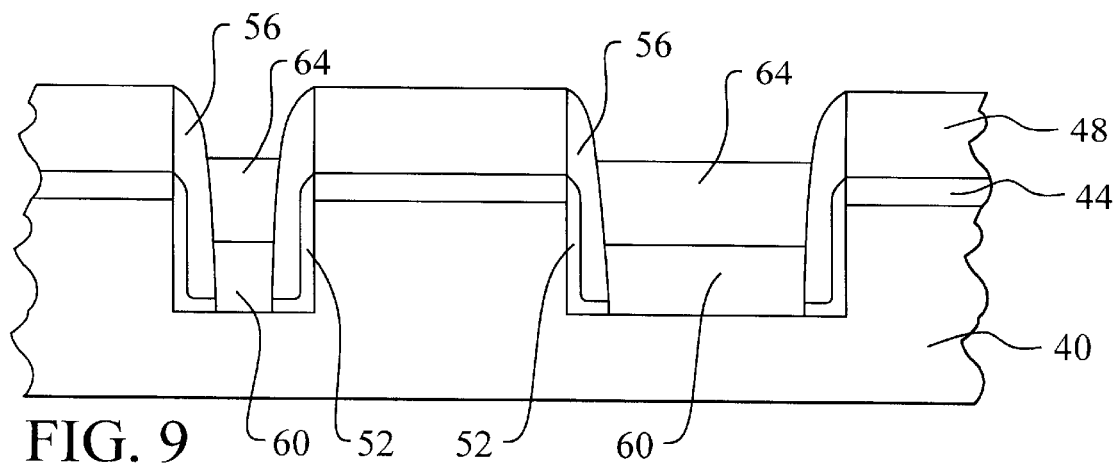

Referring now to FIG. 9, another significant feature of the present invention is described. A trench oxide layer 64 is formed overlying the silicon layer 60. The purpose of the trench oxide layer 64 is to provide an encapsulating isolation overlying the silicon plugs 60. In the preferred embodiment, the trench oxide layer 64 is formed by a wet thermal oxidation of the silicon layer 60 at a temperature of between about 1,000 degrees C. and 1,200 degrees C. for between about 20 minutes and 50 minutes using a chemistry of $O_2$ and $H_2$. The presence of the silicon nitride layer 48 prevents the trench oxide layer 64 formed via thermal oxidation from forming outside of the trenches. This is important because it is therefore not necessary to remove excess trench oxide layer 64 using, for example, a polishing process. The trench oxide layer 64 is deposited to a thickness of between about 1,000 Angstroms and 4,000 Angstroms and fills the trenches to or above the top surface of the semiconductor substrate 40.

Figure 10:
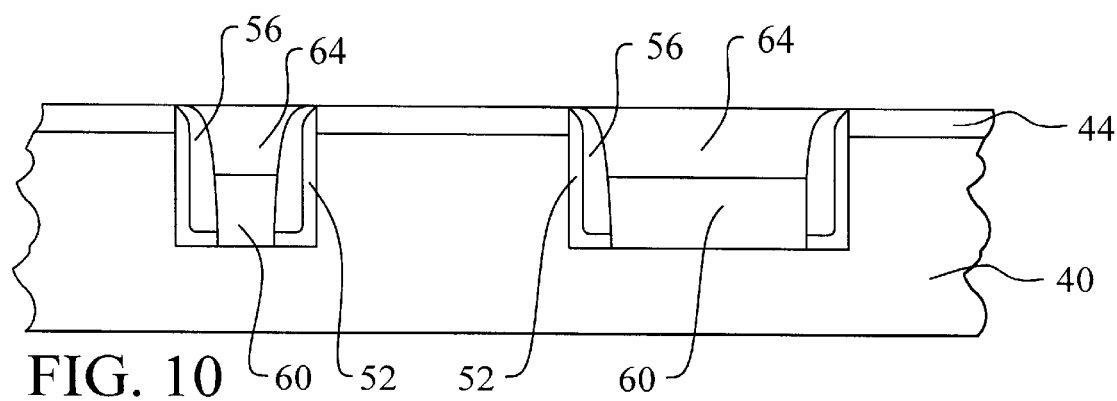

Referring now to FIG. 10, the silicon nitride layer 48 is removed. The silicon nitride layer 48 may be removed using, for example, hot phosphoric acid.

Figure 11:
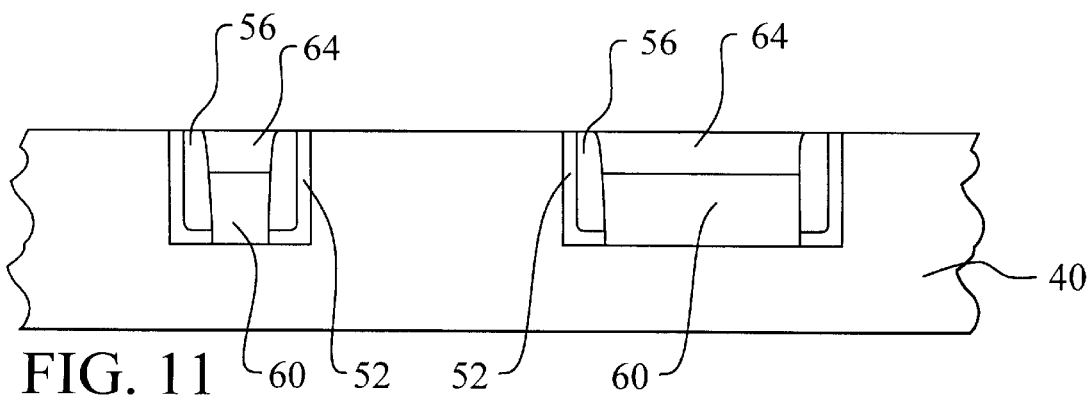

Referring now to FIG. 11, the pad oxide layer 44 is removed to complete the shallow trench isolation in the manufacture of the integrated circuit device. The pad oxide layer 44 may be removed by a quick wet etch using, for example, buffered HF.

The advantages of the process of the present invention can now be enumerated. First, an effective process for creating shallow trench isolations has been demonstrated. Second, the novel process, utilizing oxide sidewall spacers and selective epitaxial growth, creates STI structures without the use of a final polishing operation. The elimination of the polishing step saves manufacturing time and reduces cost. In addition, the dishing problem, illustrated in the prior art, is eliminated. Third, the STI structures have a flat surface topology even without the polishing step. Fourth, the use of the oxide sidewall spacers improves the performance of the STI structures by reducing adjacent device leakage.

As shown in the preferred embodiment, the present invention provides a very manufacturable process for fabricatlig shallow trench isolations, without the polishing operation, in the manufacture of integrated circuit devices.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolations in the manufacture of an integrated circuit device comprising:

growing a pad oxide layer overlying a semiconductor substrate;

depositing a silicon nitride layer overlying said pad oxide layer;

patterning said silicon nitride layer, said pad oxide layer, and said semiconductor substrate to form trenches for planned shallow trench isolations;

depositing a silicon dioxide spacer layer overlying said silicon nitride layer to partially fill said trenches;

anisotropically etching said silicon dioxide spacer layer to form sidewall spacers inside said trenches and to expose the bottom of said trenches;

selectively growing a silicon layer in said trenches wherein said silicon layer partially fills said trenches;

forming a trench oxide layer overlying said silicon layer;

removing said silicon nitride layer; and removing said pad oxide layer to complete said shallow trench isolation in the manufacture of said integrated circuit device.

2. The method according to claim 1 wherein said silicon dioxide spacer layer is deposited to a thickness of between about 800 Angstroms and 3,000 Angstroms.

3. The method according to claim 1 wherein said silicon layer is selectively grown to a thickness of between about 1,000 Angstroms and 4,000 Angstroms.

4. The method according to claim 1 wherein said step of selectively growing said silicon layer is by a selective epitaxial growth process in an epitaxial reactor at a temperature of between about 500 degrees C. and 1,200 degrees C., a pressure of between about 20 Torr and 100 Torr, using a chemistry comprising: $SiCl_4$, $H_2$, $SiH_4$, $SiH2Cl_2$, and HC1.

5. The method according to claim 1 wherein said step of forming said trench oxide layer is by a thermal oxidation of said silicon layer by a wet thermal oxidation of the silicon layer 60 at a temperature of between about 1,000 degrees C. and 1,200 degrees C. for between about 20 minutes and 50 minutes using a chemistry of $O_2$ and $H_2$.

6. The method according to claim 1 wherein said trench oxide layer is formed to a thickness of between about 1,000 Angstroms and 4,000 Angstroms.

7. The method according to claim 1 further comprising growing a liner oxide layer overlying said semiconductor substrate in said trench after said step of patterning said silicon nitride layer, said pad oxide layer, and said semiconductor substrate and before said step of depositing said silicon dioxide spacer layer.

8. The method according to claim 7 wherein said liner oxide layer is grown to a thickness of between about 50 Angstroms and 400 Angstroms.

9. A method of forming shallow trench isolations in the manufacture of an integrated circuit device comprising:

growing a pad oxide layer overlying a semiconductor substrate;

depositing a silicon nitride layer overlying said pad oxide layer;

patterning said silicon nitride layer, said pad oxide layer, and said semiconductor substrate to form trenches for planned shallow trench isolations;

growing a liner oxide layer overlying said semiconductor substrate in said trenches;

depositing a silicon dioxide spacer layer overlying said silicon nitride layer and said liner oxide layer to partially fill said trenches;

anisotropically etching said silicon dioxide spacer layer and said liner oxide layer to form sidewall spacers inside said trenches and to expose the bottom of said trenches;

selectively growing a silicon layer overlying said semiconductor substrate in said trenches wherein said silicon layer partially fills said trenches;

forming a trench oxide layer overlying said silicon layer;

removing said silicon nitride layer; and removing said pad oxide layer to complete said shallow trench isolation in the manufacture of said integrated circuit device.

10. The method according to claim 9 wherein said silicon dioxide spacer layer is deposited to a thickness of between about 800 Angstroms and 3,000 Angstroms.

11. The method according to claim 9 wherein said silicon layer is selectively grown to a thickness of between about 1,000 Angstroms and 4,000 Angstroms.

12. The method according to claim 9 wherein said step of selectively growing said silicon layer is by a selective epitaxial growth process in an epitaxial reactor at a temperature of between about 500 degrees C. and 1,200 degrees C., a pressure of between about 20 Torr and 100 Torr, using a chemistry comprising: $SiCl_4$, $H_2$, $SiH_4$, $SiH2Cl_2$, and HC1.

13. The method according to claim 9 wherein said step of forming said trench oxide layer is by a wet thermal oxidation of the silicon layer 60 at a temperature of between about 1,000 degrees C. and 1,200 degrees C. for between about 20 minutes and 50 minutes using a chemistry of $O_2$ and $H_2$.

14. The method according to claim 9 wherein said trench oxide layer is formed to a thickness of between about 1,000 Angstroms and 4,000 Angstroms.

15. The method according to claim 9 wherein said liner oxide layer is grown to a thickness of between about 50 Angstroms and 400 Angstroms.

16. A method of forming shallow trench isolations in the manufacture of an integrated circuit device comprising:

growing a pad oxide layer overlying a semiconductor substrate;

depositing a silicon nitride layer overlying said pad oxide layer;

patterning said silicon nitride layer, said pad oxide layer, and said semiconductor substrate to form trenches for planned shallow trench isolations;

growing a liner oxide layer overlying said semiconductor substrate in said trenches;

depositing a silicon dioxide spacer layer overlying said silicon nitride layer and said liner oxide layer to partially fill said trenches;

anisotropically etching said silicon dioxide spacer layer and said liner oxide layer to form sidewall spacers inside said trenches and to expose the bottom of said trenches;

selectively growing a silicon layer in said trenches wherein said silicon layer partially fills said trenches and wherein said selective growing is by selective epitaxial growth;

growing a trench oxide layer overlying said silicon layer;

removing said silicon nitride layer; and removing said pad oxide layer to complete said shallow trench isolation in the manufacture of said integrated circuit device.

17. The method according to claim 16 wherein said silicon dioxide spacer layer is deposited to a thickness of between about 800 Angstroms and 3,000 Angstroms.

18. The method according to claim 16 wherein said silicon layer is selectively grown to a thickness of between about 1,000 Angstroms and 4,000 Angstroms.

19. The method according to claim 16 wherein said step of selectively growing said silicon layer is by a selective epitaxial growth process in an epitaxial reactor at a temperature of between about 500 degrees C. and 1,200 degrees C., a pressure of between about 20 Torr and 100 Torr, using a chemistry comprising: $SiCl_4$, $H_2$, $SiH_4$, $SiH2Cl_2$, and HC1.

20. The method according to claim 16 wherein said trench oxide layer is grown to a thickness of between about 1,000 Angstroms and 4,000 Angstroms.

* * * * *

UNITED STATES PATENT AND TRADEMARK OFFICE
CERTIFICATE OF CORRECTION

PATENT NO.   : 6,306,723 B1
DATED        : October 23, 2001
INVENTOR(S)  : Feng Chen and Kok Hin Teo It is certified that error appears in the above-identified patent and that said Letters Patent is hereby corrected as shown below:

<u>Title page,</u>
Item [74], *Attorney, Agent or Firm*, delete "Pik" and replace with -- Pike --.

Signed and Sealed this

Twenty-eighth Day of May, 2002

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.   : 6,306,723 B1
DATED        : October 23, 2001
INVENTOR(S)  : Feng Chen and Kok Hin Teo It is certified that error appears in the above-identified patent and that said Letters Patent is hereby corrected as shown below:

<u>Title page,</u>
Item [74], please delete "Rosemary L. S. Pik" and replace with
-- Rosemary L. S. Pike --.

Signed and Sealed this

Twenty-fifth Day of February, 2003

JAMES E. ROGAN
*Director of the United States Patent and Trademark Office*